United States Patent
Novikov et al.

(10) Patent No.: US 7,589,538 B2
(45) Date of Patent: Sep. 15, 2009

(54) MICROPOWER VOLTAGE-INDEPENDENT CAPACITANCE MEASURING METHOD AND CIRCUIT

(75) Inventors: Lenny M. Novikov, Fair Lawn, NJ (US); Lenworth Anderson, Bayside, NY (US)

(73) Assignee: Weiss Instruments, Inc., Holtsville, NY (US)

( * ) Notice: Subject to any disclaimer, the term of this patent is extended or adjusted under 35 U.S.C. 154(b) by 0 days.

(21) Appl. No.: 11/643,624

(22) Filed: Dec. 21, 2006

(65) Prior Publication Data

US 2007/0194800 A1    Aug. 23, 2007

Related U.S. Application Data

(60) Provisional application No. 60/753,381, filed on Dec. 21, 2005, provisional application No. 60/753,275, filed on Dec. 22, 2005.

(51) Int. Cl.
    *G01R 27/26*    (2006.01)
(52) U.S. Cl. .................. 324/676; 324/519; 324/548; 324/684
(58) Field of Classification Search .............. 324/676, 324/699, 700
See application file for complete search history.

(56) References Cited

U.S. PATENT DOCUMENTS

| | | | | | |
|---|---|---|---|---|---|
| 3,612,997 | A | * | 10/1971 | Paulkovich | 324/678 |
| 3,886,447 | A | * | 5/1975 | Tanaka | 324/678 |
| 4,283,676 | A | * | 8/1981 | Shaw | 324/679 |
| 4,683,417 | A | * | 7/1987 | De Burgat et al. | 324/659 |
| 4,831,325 | A | * | 5/1989 | Watson, Jr. | 324/678 |
| 4,910,471 | A | * | 3/1990 | Brahmbhatt et al. | 331/57 |
| 5,537,049 | A | * | 7/1996 | Oita et al. | 324/703 |
| 5,963,043 | A | * | 10/1999 | Nassif | 324/681 |
| 6,300,776 | B1 | * | 10/2001 | Schreiber et al. | 324/607 |
| 6,838,869 | B1 | * | 1/2005 | Rogers et al. | 324/158.1 |
| 2002/0033361 | A1 | * | 3/2002 | Nishioka et al. | 209/574 |

OTHER PUBLICATIONS

Heckt, Neil, LC Meter Project and Kit—L/C Meter IIB, Apr. 12, 2000, Ian Purdie's Amateur Radio Tutorial Pages, Copyright 1998-2000, Neil Heckt, Almost All Digital Electronics, 1412 Elm Street S.E., Auburn WA 98092.*

Specifications, L/C Meter IIB, Almost All Digital Electronics, 1412 Elm Street S.E., Auburn, WA 98092 Copyright 1997-2007.*

Lutz Bierl, *MSP430 Family Mixed-Signal Microcontroller Application Reports*, Texas Instruments, Literature No. SLAA024, Jan. 2000, pp. 2-208, 2-209.

(Continued)

*Primary Examiner*—Timothy J Dole
*Assistant Examiner*—Benjamin M Baldridge
(74) *Attorney, Agent, or Firm*—Gerald T. Bodner

(57) ABSTRACT

A circuit for measuring an unknown capacitance includes a reference capacitor having a known capacitance, an oscillator timing circuit, a variable frequency oscillator and a microcontroller. The oscillator timing circuit includes switches which selectively couple the unknown capacitance and the reference capacitor to the oscillator timing circuit. The variable frequency oscillator generates time varying signals which vary in frequency proportionally to the unknown capacitance and reference capacitor selectively coupled to the oscillator timing circuit. The microcontroller receives the time varying signals from the oscillator, and compares the periods of the time varying signals to determine the value of the unknown capacitance.

14 Claims, 6 Drawing Sheets

OTHER PUBLICATIONS

Notification of Transmittal of the International Search Report and the Written Opinion of the International Searching Authority, or the Declaration; International Search Report; Written Opinion of the International Searching Authority; and Notification Concerning Transmittal of International Preliminary Report on Patentability.

* cited by examiner

Operation Diagram

Capacitance Measuring Circuit Period Method Flowchart

Capacitance Measuring Circuit Frequency Measurement Flowchart

MICROPOWER VOLTAGE-INDEPENDENT CAPACITANCE MEASURING METHOD AND CIRCUIT

CROSS-REFERENCE TO RELATED APPLICATION

This application is related to U.S. utility patent application entitled "Light Powered Pressure Gauge", having Ser. No. 11/314,809, filed on Dec. 21, 2005, and having as a named inventor John W. Weiss, U.S. provisional patent application entitled "Capacitance Measuring Circuit", having Ser. No. 60/753,381, filed on Dec. 21, 2005, and having as named inventors Lenny M. Novikov and Lenworth Anderson, and U.S. provisional patent application entitled "Capacitance Measuring Circuit", having Ser. No. 60/753,275, filed on Dec. 22, 2005, and having as named inventors Lenny M. Novikov and Lenworth Anderson, the disclosure of each of which is incorporated herein by reference. Priority is hereby claimed to the aforementioned U.S. provisional patent applications Ser. Nos. 60/753,381 and 60/753,275.

BACKGROUND OF THE INVENTION

1. Field of the Invention

The present invention generally relates to capacitive sensors, and more particularly relates to methods and circuits for precisely measuring the capacitance of a component or circuit.

2. Introduction

While working with capacitive sensors, there often comes a need for a low-cost high resolution circuit to measure the absolute value of the small capacitance with a high degree of precision. The task becomes even more complicated when it needs to be performed with low current consumption, and under changing voltage conditions commonly found in solar cell powered systems, such as the pressure gauge disclosed in U.S. utility patent application entitled "Light Powered Pressure Gauge", having Ser. No. 11/314,809, filed on Dec. 21, 2005, and having as a named inventor John W. Weiss, the disclosure of which is incorporated herein by reference.

Description of the Prior Art

There are a number of conventional approaches to this problem. For example, the conventional Wheatstone Bridge configuration (FIG. 1) for measuring an unknown capacitance uses an AC powered capacitive bridge to compare the Cx (unknown capacitance) to Cref (reference capacitance). The imbalance of the bridge produces an AC voltage at the diagonal of the bridge that has to be rectified, amplified and filtered with high precision, and then fed into an analog-to-digital converter to obtain a digital equivalent of the measured Cx/Cref ratio. The method requires an expensive and power consuming analog front-end circuitry, and an independent stable AC voltage source for the bridge excitation.

Another conventional circuit configuration for measuring capacitance makes use of a charge amplifier (FIG. 2) to obtain the Cx/Cref ratio. In this case, the AC voltage source can be referenced to the common ground of the circuit, and the circuit can operate in a ratiometric voltage independent mode. However, all the front end requirements of the previous approach (i.e., the Wheatstone bridge configuration) remain in place with the charge amplifier configuration. The imperfections of the operational amplifier used in the charge amplifier configuration also heavily affect the precision of the circuit.

Another conventional approach (FIG. 3) for measuring capacitance, described in detail in a Texas Instruments MSP430 Family Application Reports (Literature Number SLAA024, pp. 2-208, 2-209), alternatively charges Cx and Cref through the same resistor R from the same Vcc DC voltage source up to the voltage level of the source through switch SW1, and then discharges the respective capacitor through the same resistor R to the ground through switch SW1. The discharge time from the beginning of the discharge process till the moment determined by a comparator when the voltage at the capacitor reaches a nonzero Vth threshold level is measured by a timer, and the ratio of the discharge times is used to calculate the Cx/Cref ratio. This method also allows to account for the stray capacitance Cs by making an extra charge-discharge cycle with SW2 and SW3 switches open. While this method requires no signal conditioning circuitry, its use is limited to relatively high values of the Cx and Cref capacitances. Small value capacitors (below 100 pF) dictate the use of a high value resistor R (tens of MegOhms) to provide time intervals sufficient for precise ratio calculations. The discharge currents move into a nanoAmp area, where circuit leakages impair the precision.

OBJECTS AND SUMMARY OF THE INVENTION

It is an object of the present invention to provide a capacitance measuring circuit and method that accurately measure unknown capacitance values.

It is another object of the present invention to provide a capacitance measuring circuit which requires low power for its operation.

It is still another object of the present invention to provide a capacitance measuring circuit that does not require an analog-to-digital converter to obtain a digital equivalent of the measured capacitance.

It is a further object of the present invention to provide a capacitance measuring circuit that can be inexpensively manufactured.

It is still a further object of the present invention to provide a circuit and method for measuring capacitance that account for stray capacitance that may have otherwise affected the capacitance measurements.

It is yet a further object of the present invention to provide a capacitance measuring circuit that is not voltage dependent when measuring an unknown capacitance value.

It is another object of the present invention to provide a capacitance measuring circuit and method that can measure small value capacitances.

It is still a further object of the present invention to provide a capacitance measuring circuit that can be compensated for temperature and voltage variations.

In accordance with one form of the present invention, a circuit for measuring an unknown capacitance includes a reference capacitor having a known capacitance, an oscillator timing circuit, a variable frequency oscillator and a microcontroller. The oscillator timing circuit includes switches which selectively couple the unknown capacitance and the reference capacitor to the oscillator timing circuit. The variable frequency oscillator generates time varying signals which vary in frequency proportionally to the unknown capacitance and reference capacitor selectively coupled to the oscillator timing circuit. The microcontroller receives the time varying signals from the oscillator, and compares the periods of the time varying signals to determine the value of the unknown capacitance.

A method of measuring an unknown capacitance in accordance with the present invention includes the steps of generating a first time varying signal which has a period that is proportional to the unknown capacitance, generating a second time varying signal which has a period that is proportional to a known reference capacitance, comparing the periods of the first and second time varying signals and determining the value of the unknown capacitance from the comparison of the periods of the first and second time varying signals.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

The current invention provides a low power voltage independent method and a circuit for high resolution capacitance measurement that overcome all the drawbacks of the prior art examples discussed above.

The following description and the circuitry are provided for the purpose of illustration and not the limitation of scope of the current invention. It is understood that other types of switches, oscillators and other components can be used without departing from the scope of the invention.

Figure 4:
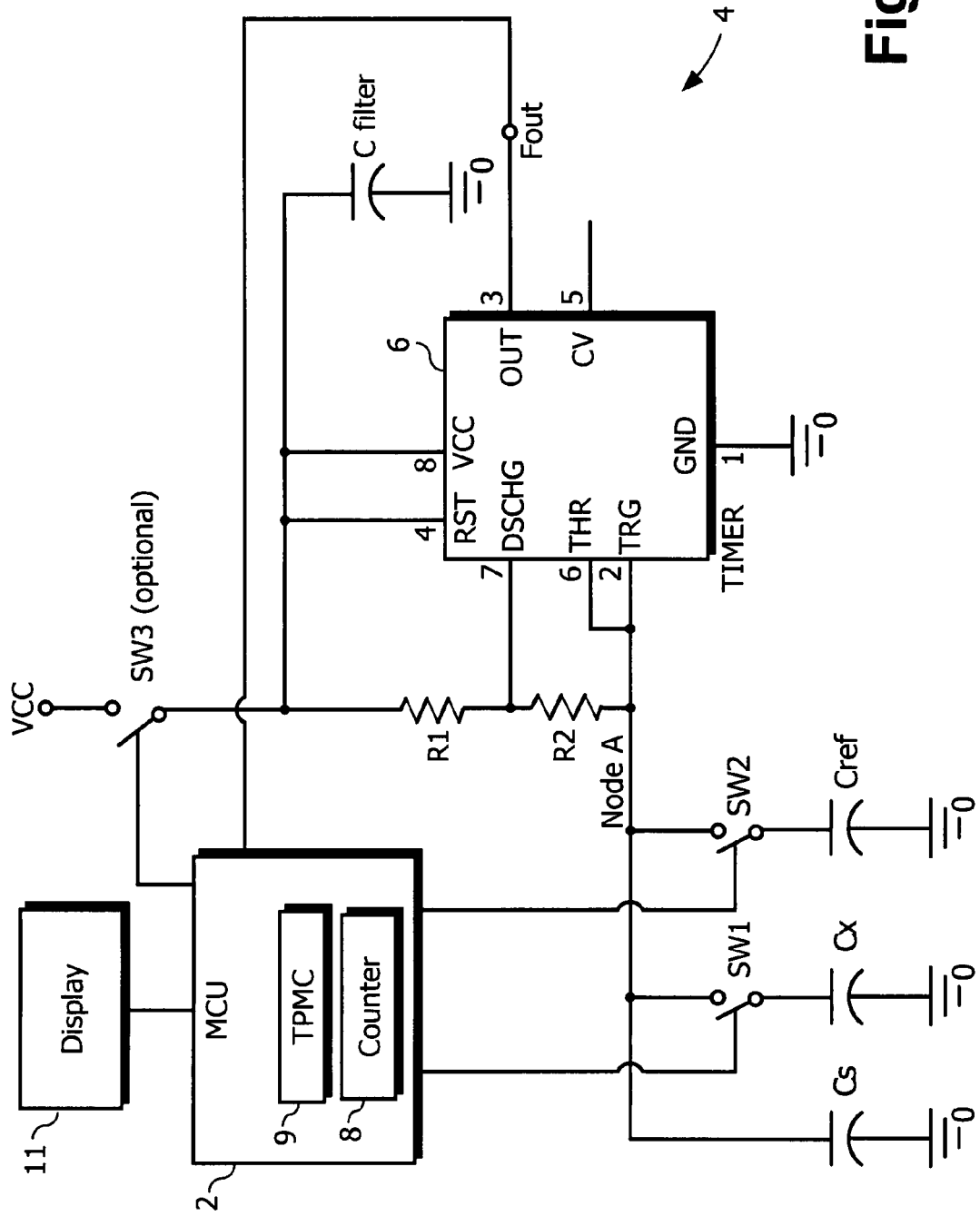
FIG. 4 is a schematic diagram of a capacitance measuring circuit formed in accordance with the present invention.

As shown in FIG. 4, the preferred embodiment comprises a preferably low-power generic microcontroller 2 and a front end circuit 4. The microcontroller 2 (hereafter MCU) operates the front end circuit 4 and receives a digital signal from the front end circuit 4 in the form of blocks of pulses (periodic signals), each block having its own frequency of pulses or corresponding period. The MCU 2 then processes the signals and outputs the result in any form including but not limited to the display readout. The processing does not require an analog-to-digital conversion.

The front end 4 (FIG. 4) comprises a variable frequency oscillator built around a preferably micropower generic timer 6 in an astable operation mode, and three electrically controllable switches SW1, SW2, and optional SW3. The timing circuit of the oscillator includes resistors R1 and R2 and any capacitance attached to the Node A. The switches SW1 and SW2, resistors R1 and R2, and the capacitance at Node A form part of an oscillator timing circuit (generally, a series R-C network having a grounded capacitor).

More specifically, and again referring to FIG. 4 of the drawings, it will be seen that the timer 6 may be one of many timers that are suitable for use and available in the market, such as the LMC555/LM555/NE555/SA555 family of timers manufactured and distributed by a number of manufacturers, such as National Semiconductor or Fairchild Semiconductor Corporation. Assuming that the timer 6 chosen is the aforementioned LM555 series of timers, then the ground pin (Pin 1) is grounded, the control voltage pin (Pin 5) is open circuited, the output pin (Pin 3) on which the time varying signals $F_{out}$ are generated is connected to the MCU 2, the Vcc pin (Pin 8) is connected to one end of a filter capacitor (C filter), the other end of which is grounded, and to the first contact of switch SW3, the reset pin (Pin 4) is similarly connected to the same end of the filter capacitor and the first contact of switch SW3 as the Vcc pin, the discharge pin (Pin 7) is connected to the junction between the first ends of resistors R1 and R2, and the threshold pin (Pin 6) and the trigger pin (Pin 2) are connected to Node A.

Node A is connected to the second side of resistor R2, to the first contact of switch SW2, to the first contact of switch SW1 and, effectively, to one side of the stray capacitance Cs, whose other side is grounded, which is included for illustrative purposes, that is, to illustrate that stray capacitances are taken into effect by the capacitance measuring circuit of the present invention (i.e., Cs is not a physical capacitor).

The second contact of switch SW2 is connected to one side of a reference capacitor Cref, whose other side is grounded. The second contact of switch SW1 is connected to one end of the unknown capacitance Cx, whose other end is grounded. Node A is also connected to the second end of resistor R2. The second end of resistor R1 is connected to the same first contact of switch SW3 to which the reset and Vcc pins of the timer 6 are connected. The second contact of switch SW3 is connected to Vcc (the supply voltage for the circuit).

Each of switches SW1, SW2 and SW3 is shown for simplicity purposes as single pole, single throw electronic switches. The switches are controlled by the MCU 2, as illustrated by FIG. 4 of the drawings, with the MCU 2 providing control signals to each of the switches. The MCU 2 will also provide an output signal which is equal to or proportional to the measured value of the unknown capacitance Cx, and such capacitance may be displayed on display 11 coupled to MCU 2.

The timer 6 in an astable mode outputs a pulse train with a period according to the following equation:

$$T=0.693(R1+2*R2)C,$$

$$\text{or } T=kC, \quad (1)$$

where C—is a capacitance at the Node A, and k=0.693 (R1+2*R2).

It is obvious that the equation (1) does not include the Vcc value; therefore, the circuit operation is not voltage dependent. However, it is understood that other types of oscillators can be used, where the coefficient k may include a voltage dependent component. It will be shown later that, as long as the Vcc value stays constant within the measurement cycle period, it does not affect the measurement results.

Let us assume for now that the optional switch SW3 stays closed all the time, and the front end circuitry is continuously powered.

According to the equation (1), when the switches SW1 and SW2 are open, the oscillator output signal has a period of $$T_{Cs}=kCs \quad (2),$$

where Cs is not a physical capacitor but a sum of the physical circuit stray capacitance and a capacitance corresponding to the group delay of the internal oscillator circuitry.

With the switch SW1 conducting, and the switch SW2 open, the output period changes to $$T_{Cx+Cs}=k(Cx+Cs) \quad (3).$$

With the switch SW2 conducting, and the switch SW1 open, the output period changes to $$T_{Cref+Cs}=k(Cref+Cs) \quad (4).$$

The system of the equations (2), (3), and (4) resolves into the following:

$$Cx/Cref=(T_{Cx+Cs}-T_{Cs})/(T_{Cref+Cs}-T_{Cs}) \quad (5)$$

The equation (5) confirms that the calculated Cx/Cref ratio does not depend on the value of the coefficient k as long as it does not change within the measurement cycle.

The unknown capacitance Cx can be calculated from the equation $$Cx=Cref(T_{Cx+Cs}-T_{Cs})/(T_{Cref+Cs}-T_{Cs}) \quad (6).$$

Thus, the Cref capacitor is the only critical component of the circuit affecting the precision and stability of the Cx measurement.

Figure 1:
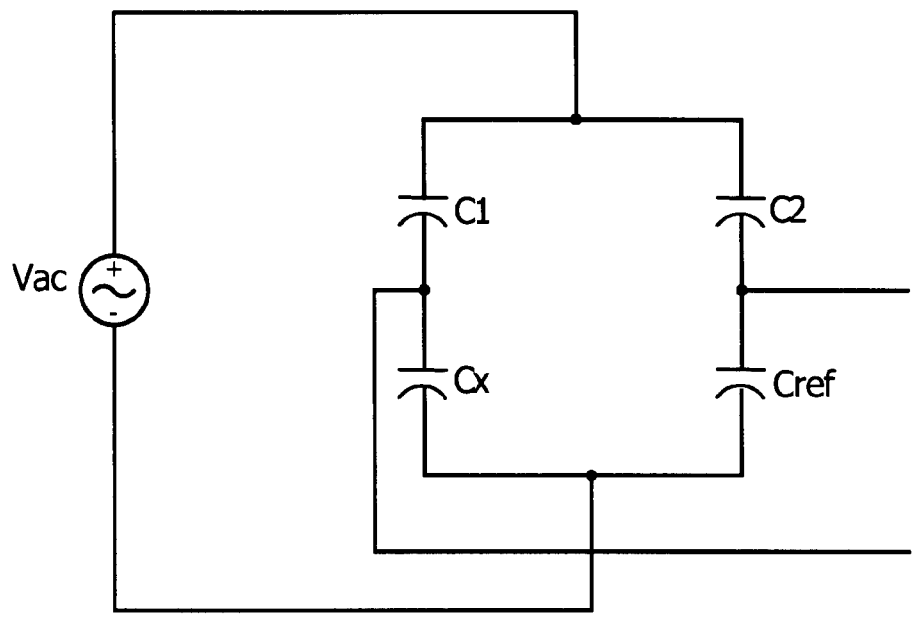
FIG. 1 is a schematic diagram of a conventional Wheatstone bridge capacitance measuring circuit.
Figure 2:
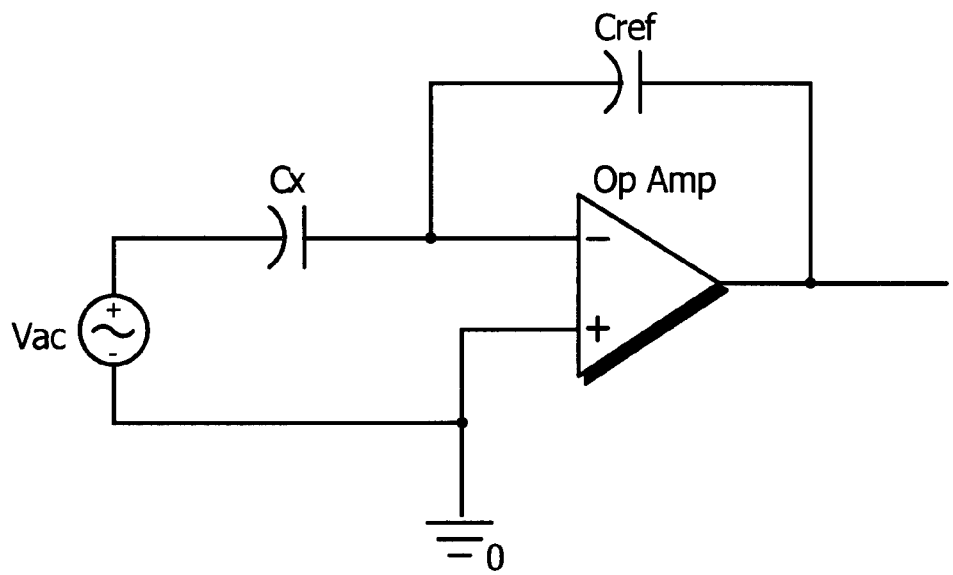
FIG. 2 is a schematic diagram of a conventional charged amplifier capacitance measuring circuit.
Figure 3:
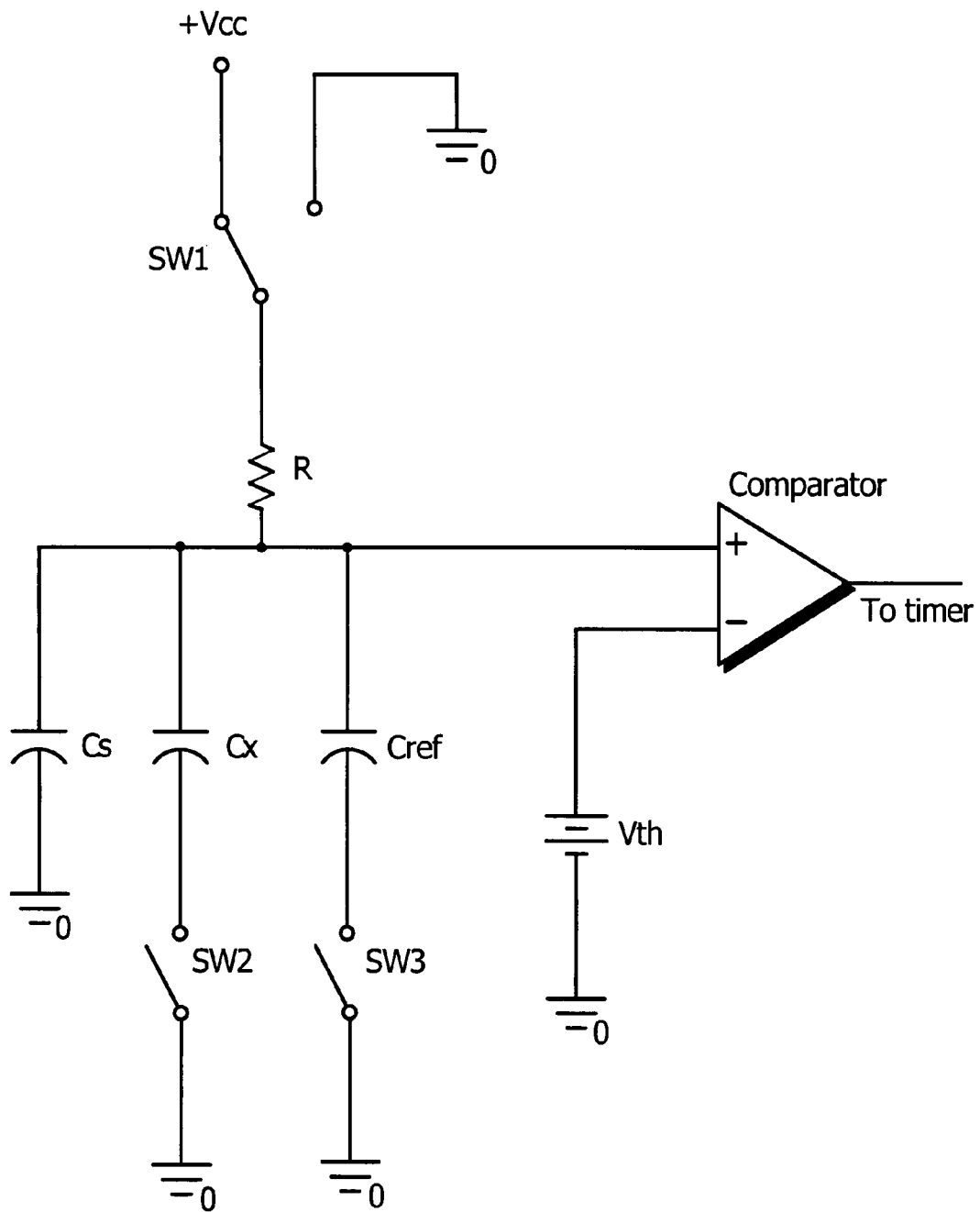
FIG. 3 is a schematic diagram of a conventional switched capacitors capacitance measuring circuit.

The proposed arrangement uses much lower resistor values than the conventional switched capacitors approach described earlier and shown in FIG. 3; therefore, it is much less sensitive to the printed circuit board and component leakages and provides measurement of the capacitance value down to a few picoFarads. The resolution of this measurement method of the present invention is limited by the resolution of the period measurement and the division procedure, and can be quite high. The period measurement resolution increases with the increase of the measurement time. However, the increased measurement time requires more energy from the power source, which may be undesirable in some battery or solar power operated systems.

The SW3 power switch may be used to power the oscillator circuit down between the measurement cycles, thereby reducing the average current consumption by taking advantage of the system duty cycle.

Figure 5:
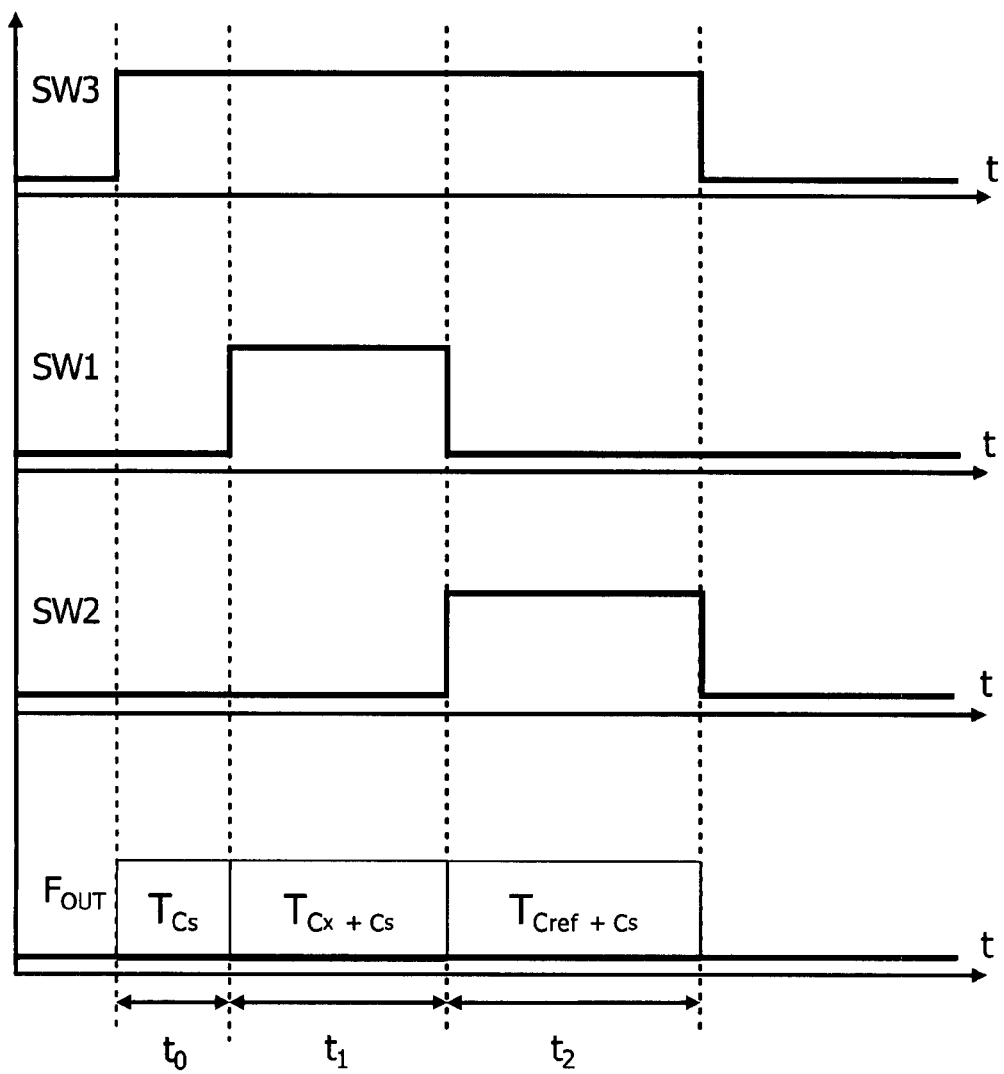
FIG. 5 is an operation diagram of the capacitance measuring circuit of the present invention shown in FIG. 4 and operating in accordance with a method of the present invention for measuring capacitance.

The Operation Diagram (FIG. 5) for the present invention illustrates the measurement cycle flow. The MCU 2 generates control signals to the switches SW1, SW2, and SW3. The high level on the diagram corresponds to the switch in a conducting state. The low level relates to the open state. The $F_{out}$ portion illustrates three time periods ($t_0$, $t_1$, and $t_2$) of the oscillator output signal corresponding to the various states of the switches.

The measurement cycle begins when the switch SW3 turns on and applies power to the oscillator. The switches SW1 and SW2 stay open for the time period $t_0$ while the $T_{Cs}$ is measured by the MCU 2. Then switch SW1 turns on and connects the unknown capacitance Cx to the Node A for the time period $t_1$ while the period $T_{Cx+Cs}$ is measured by the MCU 2. After that, the switch SW1 turns off, and the switch SW2 turns on and connects the reference capacitance Cref to the Node A for the time period $t_2$ while the period $T_{Cref+Cs}$ is measured by the MCU 2. Then, all of the switches turn off, and the MCU 2 processes the results.

A variety of control methods may be used to optimize the oscillator runtime (and the average power consumption) in each time period while preserving the desired resolution level. The two methods described in detail herein illustrate just two possible approaches as an example.

The Period Method of the present invention accumulates a number of pulses of the oscillator output signal required to achieve the resolution in a counter 8 (either external or internal to the MCU 2), and then switches the system to the next mode. For example, to achieve the resolution of 0.1% at least 1000 pulses should be accumulated. The time required to accumulate the preset number of pulses is measured by the MCU timer based on the crystal controlled time base, or by a time period measurement circuit 9 integrally formed as part of MCU 2 or as a separate circuit. At the end of the measurement cycle, the MCU 2 processes the three numbers, corresponding to the appropriate output signal periods multiplied by a number of pulses (1000 in our example), in accordance with equation (6), and outputs the result. (It is envisioned, however, that the predetermined number of pulses (e.g., 1000) of the three time varying signals occurring from which time periods $t_0$, $t_1$ and $t_2$ are derived need not be same and may be different from one another.) The resulting time periods $t_0$, $t_1$, and $t_2$ closely follow the changing period of the oscillator output frequency, and provide the shortest possible runtime of the oscillator. However, this approach requires a high frequency MCU timer time base, which may negate some of the power savings offered by the optimal oscillator runtime.

The Frequency Method of the present invention assumes that the maximum values for wave periods $T_{Cs}$, $T_{Cx+Cs}$, and $T_{Cref+Cs}$ are known. The fixed time periods $t_0$, $t_1$, and $t_2$ are calculated to accept at least the required number of pulses (e.g., 1000), and are generated by the MCU timer based on a low frequency, crystal-operated time base (e.g., 32.768 kHz). The number of pulses accumulated within each time period is proportional to the frequency of the output signal.

The acquired frequencies can be converted into periods as follows $$T=1/(n \times F) \quad (7),$$

where T is a period, n is a scale coefficient, and F is an accumulated number proportional to the corresponding frequency.

If all three time periods $t_0$, $t_1$, and $t_2$ are selected equal, then n=1. It is envisioned, however, that the three predetermined time periods $t_0$, $t_1$ and $t_2$ need not be the same and may be different from one another.

The frequency method obviously provides excessive runtime for the oscillator in most of the cases. However, the appropriate scaling of the time periods and the ability to run the MCU clock at low frequency can result in a very efficient system.

Both methods require just the short time stability from the time base, with the long term fluctuations not affecting the system performance.

Accumulation of large number of pulses in both methods provides an additional benefit of integrating the jitter and noise out of the end results.

Figure 6:
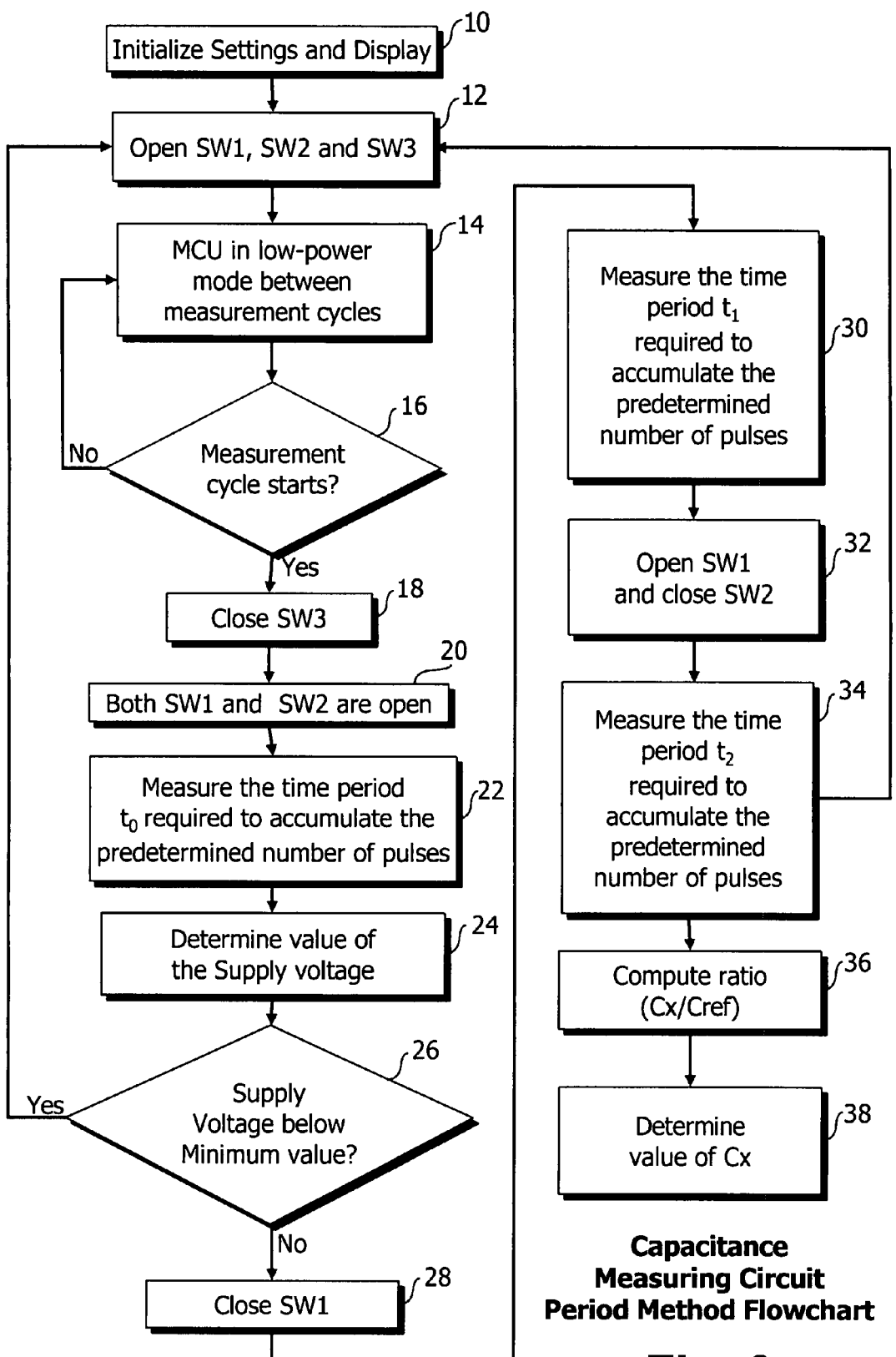
FIG. 6 is a flow chart of one method of the present invention for measuring capacitance, using what is referred to herein as the "period method".
Figure 7:
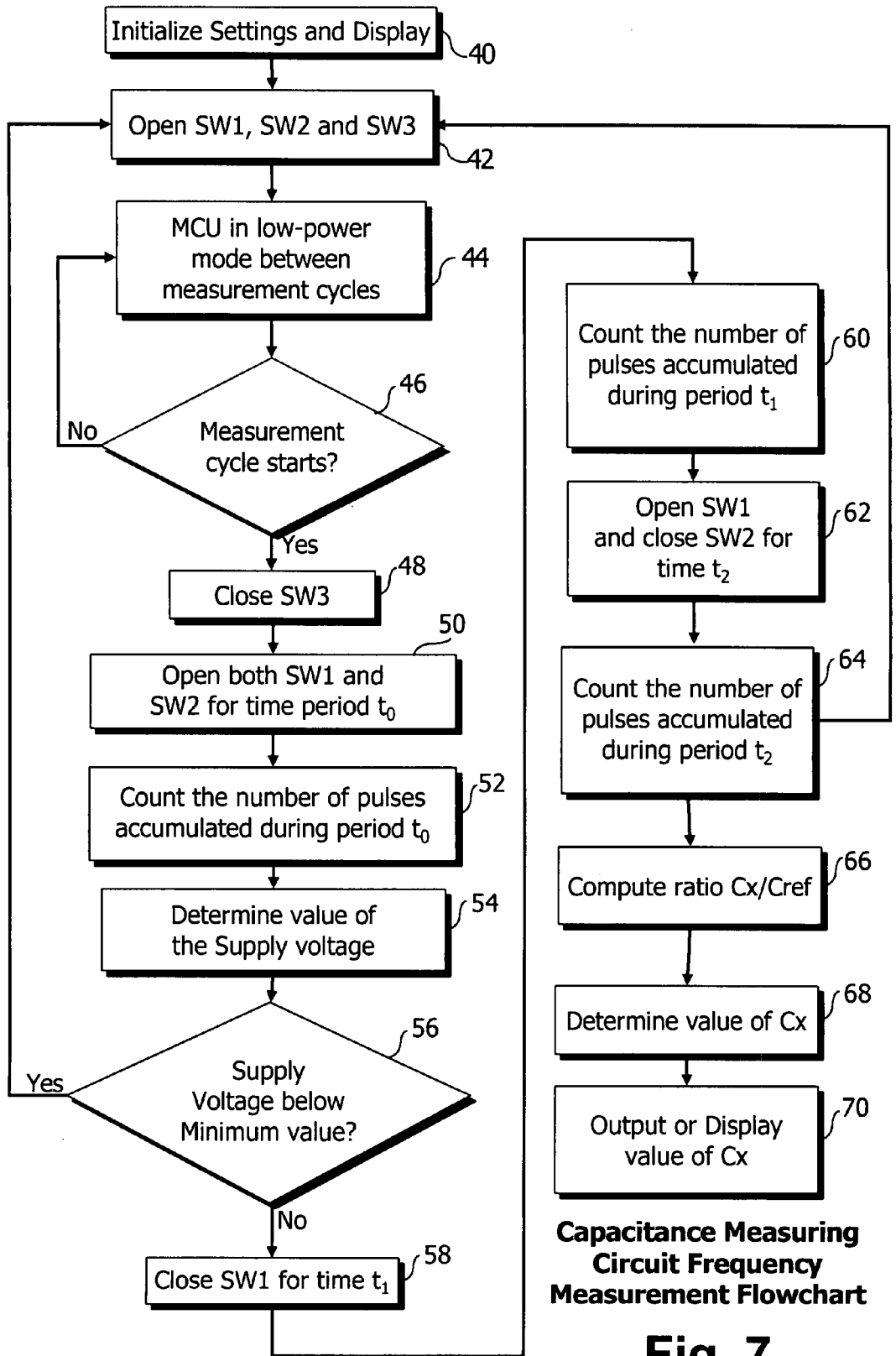
FIG. 7 is a flow chart of another method of the present invention for measuring capacitance, using what is referred to herein as the "frequency method".

A flow chart of the operation of the capacitance measuring circuit of the present invention using the period method is shown in FIG. 6, and using the frequency method is shown in FIG. 7.

More specifically, the operation of the capacitance measuring circuit of the present invention using the period method will now be described. First, the settings and the display of the capacitance measuring circuit are initialized (Block 10). Then, switches SW1, SW2 and, optionally, SW3 are opened (Block 12). The MCU 2 is placed in a low-power mode between measurement cycles (Block 14). If the measurement cycle starts (Block 16), switch SW3 is closed (Block 18). If the measurement cycle does not start, the MCU 2 remains in its low-power mode (Block 14).

With the closure of switch SW3 (Block 18), both switches SW1 and SW2 are in an open state (Block 20). Now, the time period to required to accumulate a first predetermined number of pulses is measured (Block 22). This is the first time varying signal that is generated by the oscillator, and the period of this signal is proportional to the stray capacitance. Then, the value of the supply voltage is determined (Block 24).

If the supply voltage is below a minimum value (Block 26), then the method repeats the steps shown in Blocks 12 through 26, starting with switches SW1, SW2 and SW3 being opened. However, if the supply voltage is not below a minimum value (Block 26), then switch SW1 is closed (Block 28). Now, the time period $t_1$ required to accumulate a second predetermined number of pulses is measured (Block 30). This is the second time varying signal that is generated by the oscillator, and the period of this signal is proportional to the combination of the unknown capacitance and the stray capacitance. Switch SW1 is then opened, and switch SW2 is closed (Block 32). Now, the time period $t_2$ required to accumulate a third predetermined number of pulses is measured (Block 34). This is the third time varying signal that is generated by the oscillator, and the period of this signal is proportional to the combination of the known reference capacitance and the stray capacitance. Switches SW1, SW2 and, optionally, SW3 are then opened (Block 12). The steps in Blocks 12 through 34 may be repeated, as required, while the MCU 2 determines the value of the unknown capacitance from the previous measurements.

Next, the ratio of Cx divided by Cref is computed (Block 36) by the MCU 2, and the value of the unknown capacitance, Cx, is determined by the MCU 2 (Block 38) and outputted on, for example, a digital display 11 (see FIG. 4).

The operation of the capacitance measuring circuit of the present invention using the frequency method, as shown in FIG. 7, will now be described. First, the settings and display of the capacitance measuring circuit are initialized (Block 40). Then, the switches SW1, SW2 and, optionally, SW3 are opened (Block 42). The MCU 2 is placed in a low-power mode between measurement cycles (Block 44).

When the measurement cycle starts (Block 46), switch SW3 is closed (Block 48). If the measurement cycle is not started (Block 46), the MCU 2 remains in its low-power mode (Block 44).

Again, with the closing of switch SW3, switches SW1 and SW2 remain open for a time period $t_0$ (Block 50). Then, the number of pulses accumulated during period $t_0$ (a first predetermined time period) are counted (Block 52). This is the first time varying signal that is generated by the oscillator, and the period of this signal is proportional to the stray capacitance.

The value of supply voltage is then determined (Block 54). If the supply voltage is below a minimum value (Block 56), the sequence of steps shown in Blocks 42 through 56 are repeated, starting with opening switches SW1, SW2 and, optionally, SW3 (Block 42). If the supply voltage is not below a minimum value (Block 56), then the operation of the capacitance measuring circuit continues by closing switch SW1 for time $t_1$ (a second predetermined time period) (Block 58). Again, the number of pulses accumulated during period $t_1$ are counted (Block 60). This is the second time varying signal that is generated by the oscillator, and the period of this signal is proportional to the combination of the unknown capacitance and the stray capacitance.

Switch SW1 is then opened, and switch SW2 is closed for time $t_2$ (a third predetermined time period) (Block 62). The number of pulses accumulated during period $t_2$ are then counted (Block 64). This is the third time varying signal that is generated by the oscillator, and the period of this signal is proportional to the combination of the known reference capacitance and the stray capacitance. Switches SW1, SW2 and, optionally, SW3 are then opened (Block 42). The steps shown in Blocks 42 through 64 may be repeated, as required, while the MCU 2 determines the value of the unknown capacitance from the previous measurements.

The ratio Cx/Cref is then computed (Block 66) by the MCU 2, and the value of the unknown capacitance Cx is determined (Block 68) by the MCU 2, and the value of the unknown capacitance Cx is outputted by the MCU 2 or displayed on a display 11 (see FIG. 4) of the capacitance measuring circuit (Block 70).

It is envisioned that if it is not desired to account for the effects of stray capacitance, the steps of measuring the pulse trains with switches SW1 and SW2 being open in either the period method of FIG. 6 or the frequency method of FIG. 7 may be omitted, with the assumption that the stray capacitance is negligible or zero in the aforementioned equations and the calculations performed by MCU 2. It is further envisioned that the circuit and method of the present invention can measure one or more unknown capacitances Cx, and such capability should be understood to be within the scope of the present invention.

1. Vcc Voltage Variations

Since the preferred embodiment is expected to be used in a solar cell or battery powered applications, it is important to provide a voltage measurement means to extend the reliable circuit operation into low voltages where the front end circuitry exhibits severe nonlinearity, and to avoid displaying erroneous results when the voltage drops below a certain level due to a battery end of life condition or a low light condition for a solar cell.

Voltage induced effects manifest themselves in front end oscillator frequency variations, which are more pronounced at the lower capacitance values. To further improve the accuracy of the measurement circuit, given the extremely high resolution of the preferred embodiment solution, it is preferred that these possible frequency variations are taken into consideration when calculating the capacitors' ratio.

While a variety of well known methods such as voltage detectors and analog-to-digital converters may be used to measure voltage, the preferred embodiment circuit provides a power and cost efficient way described below.

The final circuit calibration should be performed with varying Cx at a number (at least two) of voltage values whereas the first voltage is the minimum one and the other voltages are higher, and the resulting calibration table should include a frequency (or period) of the oscillator running on a fixed capacitance, such as Cs or Cref.

During normal operation, the calibration data is interpolated and extrapolated based on an immediate value of the fixed capacitor frequency (or period). When the voltage drops below the minimum value, the results are no longer valid and should not be displayed or used.

2. Temperature Variations

To further improve the accuracy of the circuit of the present invention when it is used under a wide range of ambient temperatures and to compensate for a possible capacitive sensor temperature variation, a further enhancement to the present invention is contemplated herein. Under such conditions, it is possible that the capacitive sensor itself may exhibit some repeatable temperature related effects. To compensate for the temperature related error, the ambient temperature may be measured by periodically substituting one of the front end oscillator timing resistors R1 or R2 with a thermistor (or any other temperature sensitive device) network, or periodically adding a thermistor in parallel with either resistor R1 or R2. The frequency (or period) of the oscillator running on a fixed capacitance, such as Cs or Cref, under a number of ambient temperature values becomes another entry in a calibration table. During normal operation, the results from the calibration table may be adjusted for the temperature related error.

3. Simplifying the Circuit

When both voltage and temperature compensation features are used, the circuit may be simplified by omitting the Cs measurement. In this case, the Cx value should be calibrated directly against the Cx/Cref ratio, and only Cref should be used for the voltage and temperature related compensation.

4. Measuring Additional Unknown Capacitors

In a system that has the known Cref and two or more unknown capacitors Cx and Cy, the same principals apply. This may occur with a differential or duplex capacitor measuring system. In this case, the second capacitor is used to improve the resolution over a single capacitor. Should Cx decrease upon upscale change, and Cy increase with upscale change, it can be arranged that at some point in the range, Cx is equal to Cy. Also at some point in the scale, the slopes are equal yet opposite, having the same change with incremental change in the property being measured. The measurement can favor the unknown capacitor with greatest slope to have the highest resolution. In addition, should the system have a permanent shift, as when a sensitive meter is dropped, the cross over point will change, indicating an over range condition has occurred or an unexpected shift has occurred. Related circuitry that drives a display can provide an alert message suggesting a check or recalibration is necessary.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A voltage independent method of measuring an at least one unknown capacitance, which comprises the steps of:
  generating a first time varying signal using a voltage independent oscillator circuit comprising a single integrated circuit analog timing device, the first time varying signal having a period which is linearly proportional to the at least one unknown capacitance;
  counting a number of cycles of the first time varying signal occurring within a first predetermined time period and providing a counted number of cycles of the first time varying signal;
  determining the period of the first time varying signal from the counted number of cycles of the first time varying signal;
  generating a second time varying signal using the same voltage independent oscillator circuit as is used to generate the first time varying signal, the second time varying signal having a period which is linearly proportional to a known reference capacitance;
  counting a number of cycles of the second time varying signal occurring within a second predetermined time period and providing a counted number of cycles of the second time varying signal;
  determining the period of the second time varying signal from the counted number of cycles of the second time varying signal;
  comparing the period of the first time varying signal with the period of the second time varying signal; and
  determining the value of the at least one unknown capacitance from the comparison of the periods of the first time varying signal and the second time varying signal.

2. A voltage independent method of measuring an at least one unknown capacitance as defined by claim 1, wherein the first predetermined time period is substantially equal to the second predetermined time period.

3. A voltage independent method of measuring an at least one unknown capacitance and compensating for stray capacitance, which comprises the steps of:
  generating a first time varying signal using a voltage independent oscillator circuit comprising a single integrated circuit analog timing device, the first time varying signal having a period which is linearly proportional to the stray capacitance;
  counting a number of cycles of the first time varying signal occurring within a first predetermined time period and providing a counted number of cycles of the first time varying signal;
  determining the period of the first time varying signal from the counted number of cycles of the first time varying signal;
  generating a second time varying signal using the same voltage independent oscillator circuit as is used to generate the first time varying signal, the second time varying signal having a period which is linearly proportional to a combination of the at least one unknown capacitance and the stray capacitance;
  counting a number of cycles of the second time varying signal occurring within a second predetermined time period and providing a counted number of cycles of the second time varying signal;
  determining the period of the second time varying signal from the counted number of cycles of the second time varying signal;
  generating a third time varying signal using the same voltage independent oscillator circuit as is used to generate the first time varying signal and the second time varying signal, the third time varying signal having a period which is linearly proportional to a combination of a known reference capacitance and the stray capacitance;
  counting a number of cycles of the third time varying signal occurring within a third predetermined time period and providing a counted number of cycles of the third time varying signal;
  determining the period of the third time varying signal from the counted number of cycles of the third time varying signal;
  comparing the periods of the first time varying signal, the second time varying signal and the third time varying signal; and
  determining the value of the at least one unknown capacitance from the comparison of the periods of the first time varying signal, the second time varying signal and the third time varying signal.

4. A voltage independent method of measuring an at least one unknown capacitance and compensating for stray capacitance, which comprises the steps of:
  generating a first time varying signal using a voltage independent oscillator circuit comprising a single integrated circuit analog timing device, the first time varying signal having a period which is linearly proportional to the stray capacitance;
  measuring the time period in which a first predetermined number of cycles of the first time varying signal occurs and providing a measured time period of the first time varying signal;

determining the period of the first time varying signal from the measured time period of the first time varying signal;

generating a second time varying signal using the same voltage independent oscillator circuit as is used to generate the first time varying signal, the second time varying signal having a period which is linearly proportional to a combination of the at least one unknown capacitance and the stray capacitance;

measuring the time period in which a second predetermined number of cycles of the second time varying signal occurs and providing a measured time period of the second time varying signal;

determining the period of the second time varying signal from the measured time period of the second time varying signal;

generating a third time varying signal using the same voltage independent oscillator circuit as is used to generate the first time varying signal and the second time varying signal, the third time varying signal having a period which is linearly proportional to the combination of a known reference capacitance and the stray capacitance;

measuring the time period in which a third predetermined number of cycles of the third time varying signal occurs and providing a measured time period of the third time varying signal;

determining the period of the third time varying signal from the measured time period of the third time varying signal;

comparing the periods of the first time varying signal, the second time varying signal and the third time varying signal; and determining the value of the at least one unknown capacitance from the comparison of the periods of the first time varying signal, the second time varying signal and the third time varying signal.

5. A voltage independent method as defined by claim 4, wherein at least one of the first predetermined number of cycles of the first time varying signal, the second predetermined number of cycles of the second time varying signal and the third predetermined number of cycles of the third time varying signal is substantially equal to at least another of the first predetermined number of cycles of the first time varying signal, the second predetermined number of cycles of the second time varying signal and the third predetermined number of cycles of the third time varying signal.

6. A voltage independent method as defined by claim 4, wherein the first predetermined number of cycles of the first time varying signal, the second predetermined number of cycles of the second time varying signal and the third predetermined number of cycles of the third time varying signal are substantially equal.

7. A voltage independent circuit for measuring an at least one unknown capacitance, which comprises:

a known reference capacitance;

a single, voltage independent, variable frequency oscillator comprising a single integrated circuit analog timing device selectively coupled to the known reference capacitance and the at least one unknown capacitance, the single, voltage independent oscillator selectively generating at least two time varying signals which include a first time varying signal and a second time varying signal, the first time varying signal having a period which is linearly proportional to the at least one unknown capacitance, the second time varying signal having a period which is linearly proportional to the known reference capacitance; and a counter, the counter being responsive to the first time varying signal and the second time varying signal, the counter counting a number of cycles of the first time varying signal occurring within a first predetermined time period and providing a counted number of cycles of the first time varying signal, the counter counting a number of cycles of the second time varying signal occurring within a second predetermined time period and providing a counted number of cycles of the second time varying signal; and a microcontroller, the microcontroller being responsive to the first time varying signal and the second time varying signal, the microcontroller further determining the period of the first time varying signal from the counted number of cycles of the first time varying signal and determining the period of the second time varying signal from the counted number of cycles of the second time varying signal, and comparing the period of the first time varying signal with the period of the second time varying signal, and determining the value of the at least one unknown capacitance from the comparison of the periods of the first time varying signal and the second time varying signal.

8. A voltage independent circuit for measuring an at least one unknown capacitance as defined by claim 7, further comprising an oscillator timing circuit, the oscillator timing circuit having a first switch and a second switch, the first switch being responsive to a first control signal and selectively coupling the at least one unknown capacitance to the oscillator timing circuit in response to the first control signal, the second switch being responsive to a second control signal and selectively coupling the reference capacitor to the oscillator timing circuit in response to the second control signal.

9. A voltage independent circuit for measuring an at least one unknown capacitance as defined by claim 8, wherein the oscillator timing circuit includes a resistor, the resistor being selectively coupled to at least one of the at least one unknown capacitance and the reference capacitor.

10. A voltage independent circuit for measuring an at least one unknown capacitance as defined by claim 8, wherein the oscillator timing circuit includes a thermistor, the thermistor being selectively coupled to at least one of the at least one unknown capacitance and the reference capacitor.

11. A voltage independent circuit for measuring an at least one unknown capacitance and for compensating for stray capacitance, which comprises:

a known reference capacitance;

a single, voltage independent, variable frequency oscillator comprising a single integrated circuit analog timing device selectively coupled to the known reference capacitance and the at least one unknown capacitance and being responsive to the stray capacitance, the single, voltage independent oscillator selectively generating a first time varying signal, a second time varying signal and a third time varying signal, the first time varying signal having a period which is linearly proportional to the stray capacitance, the second time varying signal having a period which is linearly proportional to a combination of the at least one unknown capacitance and the stray capacitance, the third time varying signal having a period which is linearly proportional to a combination of the known reference capacitance and the stray capacitance; and a counter, the counter being responsive to the first time varying signal and the second time varying signal, and the third time varying signal, the counter counting a number of cycles of the first time varying signal occurring within a first predetermined time period and providing a counted number of cycles of the first time varying signal; the counter counting a number of cycles of the second time varying signal occurring within a second predetermined time period and providing a counted number of cycles of the second time varying signal; the counter counting a number of cycles of the third time varying signal occurring within a third predetermined time period and providing a counted number of cycles of the third time varying signal; and a microcontroller, the microcontroller being responsive to the first time varying signal, the second time varying signal and the third time varying signal, the microcontroller further determining the period of the first time varying signal from the counted number of cycles of the first time varying signal, the period of the second time varying signal from the counted number of cycles of the second time varying signal, and the period of the third time varying signal from the counted number of cycles of the third time varying signal, comparing the periods of the first time varying signal, the second time varying signal and the third time varying signal, and determining the value of the at least one unknown capacitance from the comparison of the periods of the first time varying signal, the second time varying signal and the third time varying signal.

12. A voltage independent circuit for measuring an at least one unknown capacitance and for compensating for stray capacitance as defined by claim 11, further comprising an oscillator timing circuit, the oscillator timing circuit having a first switch and a second switch, the first switch being responsive to a first control signal and selectively coupling the at least one unknown capacitance to the oscillator timing circuit in response to the first control signal, the second switch being responsive to a second control signal and selectively coupling the reference capacitor to the oscillator timing circuit in response to the second control signal.

13. A voltage independent circuit for measuring an at least one unknown capacitance and for compensating for stray capacitance as defined by claim 12, wherein the oscillator timing circuit includes a resistor, the resistor being selectively coupled to at least one of the at least one unknown capacitance and the reference capacitor.

14. A voltage independent circuit for measuring an at least one unknown capacitance and for compensating for stray capacitance as defined by claim 12, wherein the oscillator timing circuit includes a thermistor, the thermistor being selectively coupled to at least one of the at least one unknown capacitance and the reference capacitor.

* * * * *